US012622000B2

(12) United States Patent
Cheong et al.

(10) Patent No.: US 12,622,000 B2
(45) Date of Patent: May 5, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventors: Younghun Cheong, Suwon-si (KR); Minchul Cho, Suwon-si (KR); Cheolsoo Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 488 days.

(21) Appl. No.: 18/166,322

(22) Filed: Feb. 8, 2023

(65) Prior Publication Data

US 2024/0023346 A1    Jan. 18, 2024

(30) Foreign Application Priority Data

Jul. 15, 2022    (KR) ......................... 10-2022-0087329

(51) Int. Cl.
    *H01L 23/00*        (2006.01)
    *H10B 80/00*        (2023.01)
(52) U.S. Cl.
    CPC ........... *H10B 80/00* (2023.02); *H01L 23/564* (2013.01); *H01L 24/32* (2013.01); *H01L 24/33* (2013.01); *H01L 24/45* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/32145* (2013.01); *H01L*

*2224/32225* (2013.01); *H01L 2224/33181* (2013.01); *H01L 2224/45111* (2013.01);
(Continued)

(58) Field of Classification Search
None
See application file for complete search history.

(56) References Cited

U.S. PATENT DOCUMENTS 6,333,562 B1 * 12/2001 Lin ......................... H01L 25/50
                                                        257/E21.705
7,368,811 B2    5/2008 Kang et al.
(Continued)

FOREIGN PATENT DOCUMENTS

CN        111739880 B        1/2021
KR        100593703 B1       6/2006
(Continued)

*Primary Examiner* — Cory W Eskridge
(74) *Attorney, Agent, or Firm* — Wolf, Greenfield & Sacks, P.C.

(57)        ABSTRACT

A semiconductor package includes a package substrate, a plurality of first semiconductor chips stacked on an upper surface of the package substrate in a stair-step configuration, the plurality of first semiconductor chips having an uppermost semiconductor chip at a first height from the upper surface of the package substrate, the uppermost semiconductor chip including a free end portion. Conductive wires respectively electrically connect chip pads of the first semiconductor chips to substrate pads of the package substrate. A plurality of first support structures each have a first end attached to the upper surface of the package substrate and an opposite second end attached to the free end portion of the uppermost semiconductor chip. The first support structures are inclined at an angle relative to the package substrate.

16 Claims, 20 Drawing Sheets

(52) U.S. Cl.
　　CPC .............. *H01L 2224/45124* (2013.01); *H01L*
　　　　　　*2224/45139* (2013.01); *H01L 2224/45144*
　　　　　(2013.01); *H01L 2224/45147* (2013.01); *H01L*
　　　　　　*2224/45155* (2013.01); *H01L 2224/45166*
　　　　　(2013.01); *H01L 2224/45171* (2013.01); *H01L*
　　　　　　*2224/4518* (2013.01); *H01L 2224/45184*
　　　　　(2013.01); *H01L 2224/48091* (2013.01); *H01L*
　　　　　　*2224/48105* (2013.01); *H01L 2224/48227*
　　　　　(2013.01); *H01L 2224/73215* (2013.01); *H01L*
　　　　　　*2224/73265* (2013.01); *H01L 2224/83007*
　　　　　(2013.01); *H01L 2224/85007* (2013.01); *H01L*
　　　　　　　　　　　　*2224/92147* (2013.01)

(56)　　　　　　References Cited

U.S. PATENT DOCUMENTS

| | | |
|---|---|---|
| 10,490,528 B2 | 11/2019 | Prabhu et al. |
| 11,037,910 B2 | 6/2021 | Yoo et al. |
| 2006/0151865 A1 | 7/2006 | Han et al. |
| 2011/0089575 A1* | 4/2011 | Lee ......................... H01L 23/16 |
| | | 257/777 |
| 2011/0259941 A1 | 10/2011 | Kim |
| 2019/0259742 A1* | 8/2019 | Han ........................ H01L 24/13 |
| 2023/0395446 A1* | 12/2023 | Liu ..................... H01L 25/0652 |

FOREIGN PATENT DOCUMENTS

| | | |
|---|---|---|
| KR | 20110119304 A | 11/2011 |
| WO | WO 2017/166325 A1 | 10/2017 |

* cited by examiner

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2022-0087329, filed on Jul. 15, 2022 in the Korean Intellectual Property Office (KIPO), the entire contents of which are herein incorporated by reference.

BACKGROUND

1. Field

Example embodiments relate to semiconductor packages and methods of manufacturing semiconductor packages. More particularly, example embodiments relate to multi-chip packages in which semiconductor chips of different heights are disposed on a package substrate and methods of manufacturing the same.

2. Description of the Related Art

In a multi-chip package (MCP), failures such as bouncing, wire bonding defects, and protrusion cracks may occur in an overhang portion of an uppermost semiconductor chip. Unfortunately, conventional methods for addressing these issues have certain limitations. For example, increasing a thickness of the uppermost semiconductor chip may cause an increase in an overall thickness of a semiconductor package. Adding spacer chips may consume space. Pausing manufacturing so that chip movements can dissipate may reduce productivity.

SUMMARY

Example embodiments provide a semiconductor package including a plurality of support structures for supporting an uppermost semiconductor chip.

Example embodiments provide a method of manufacturing the semiconductor package.

According to example embodiments, a semiconductor package includes a package substrate, a plurality of first semiconductor chips stacked on an upper surface of the package substrate in a stair-step configuration, the plurality of first semiconductor chips having an uppermost semiconductor chip at a first height from the upper surface of the package substrate, the uppermost semiconductor chip having a free end, conductive wires respectively electrically connecting chip pads of the first semiconductor chips to substrate pads of the package substrate, and a plurality of first support structures, each having a first end attached to the upper surface of the package substrate and an opposite second end attached to the free end portion of the uppermost semiconductor chip, wherein the first support structures are inclined at an angle relative to the package substrate.

According to example embodiments, a semiconductor package includes a package substrate, a plurality of first semiconductor chips stacked on the package substrate in a stair-step configuration, the plurality of first semiconductor chips having an uppermost semiconductor chip at a first height from the package substrate, the uppermost semiconductor chip having bonding pads on an upper surface thereof, and the uppermost semiconductor chip having a free end portion, conductive wires electrically connecting the bonding pads to the package substrate, and a plurality of first support structures, each having a first end attached to the upper surface of the package substrate and an opposite second end attached to the free end portion of the uppermost semiconductor chip, wherein the first support structures are inclined at an angle relative to the package substrate.

According to example embodiments, a method of manufacturing a semiconductor package includes forming support structures having a predetermined height in a vertical direction from an upper surface of a package substrate, stacking a plurality of semiconductor chips in a stair-step configuration up to a height equal to the predetermined height of the support structures, stacking an uppermost semiconductor chip on the support structures and the semiconductor chips, and connecting a conductive wire on the uppermost semiconductor chip, wherein forming the support structures includes, extending a conductive material drawn from a capillary to have a predetermined length equal to the predetermined height from the package substrate to contact the contact pad, forming a scratched portion in the conductive material in a state in which the conductive material is not attached to another contact pad, and erecting up the conductive material by moving the capillary in the vertical direction and cutting the scratched portion of the conductive material.

According to example embodiments, a semiconductor package may include a package substrate, a plurality of first semiconductor chips stacked on an upper surface of the package substrate in a stair-step configuration, the plurality of first semiconductor chips having an uppermost semiconductor chip having at a first height from the upper surface of the package substrate, the uppermost semiconductor chip having a free end portion, conductive wires respectively electrically connecting chip pads of the first semiconductor chips to substrate pads of the package substrate, and a plurality of first support structures, each having a first end attached to the upper surface of the package substrate and an opposite second end attached to the free end portion of the uppermost semiconductor chip, wherein the first support structures are inclined at an angle relative to the package substrate.

Thus, the support structures may support the free end portion of the uppermost semiconductor chip by compensating for a height difference between the package substrate and the uppermost semiconductor chip. Accordingly, it is possible to prevent a bouncing phenomenon of the first uppermost semiconductor chip, reduce costs, and improve productivity by using the support structures formed during wire bonding process.

BRIEF DESCRIPTION OF THE DRAWINGS

Example embodiments will be more clearly understood from the following detailed description taken in conjunction with the accompanying drawings. FIGS. 1 to 21 represent non-limiting, example embodiments as described herein.

FIG. 1 is a cross-sectional view illustrating a semiconductor package in accordance with example embodiments.

FIG. 2 is an enlarged cross-sectional view illustrating a portion 'A' in FIG. 1.

FIG. 3 is an enlarged perspective view illustrating a portion 'A' in FIG. 1.

FIG. 4 is a flowchart illustrating a method of manufacturing a semiconductor package in accordance with example embodiments.

FIGS. 5 to 12 are cross-sectional views illustrating a method of manufacturing a semiconductor package in accordance with example embodiments.

FIGS. 13 to 19 are views illustrating a method of manufacturing a semiconductor package having first support structures in accordance with example embodiments.

FIG. 20 is a cross-sectional view illustrating a semiconductor package including support structures supporting lower surfaces of additional semiconductor chips in accordance with example embodiments.

FIG. 21 is a cross-sectional view illustrating a semiconductor package including support structures supporting an uppermost semiconductor chip of additional semiconductor chips in accordance with example embodiments.

DETAILED DESCRIPTION OF EXAMPLE EMBODIMENTS

Hereinafter, example embodiments will be explained in detail with reference to the accompanying drawings.

Figure 1:
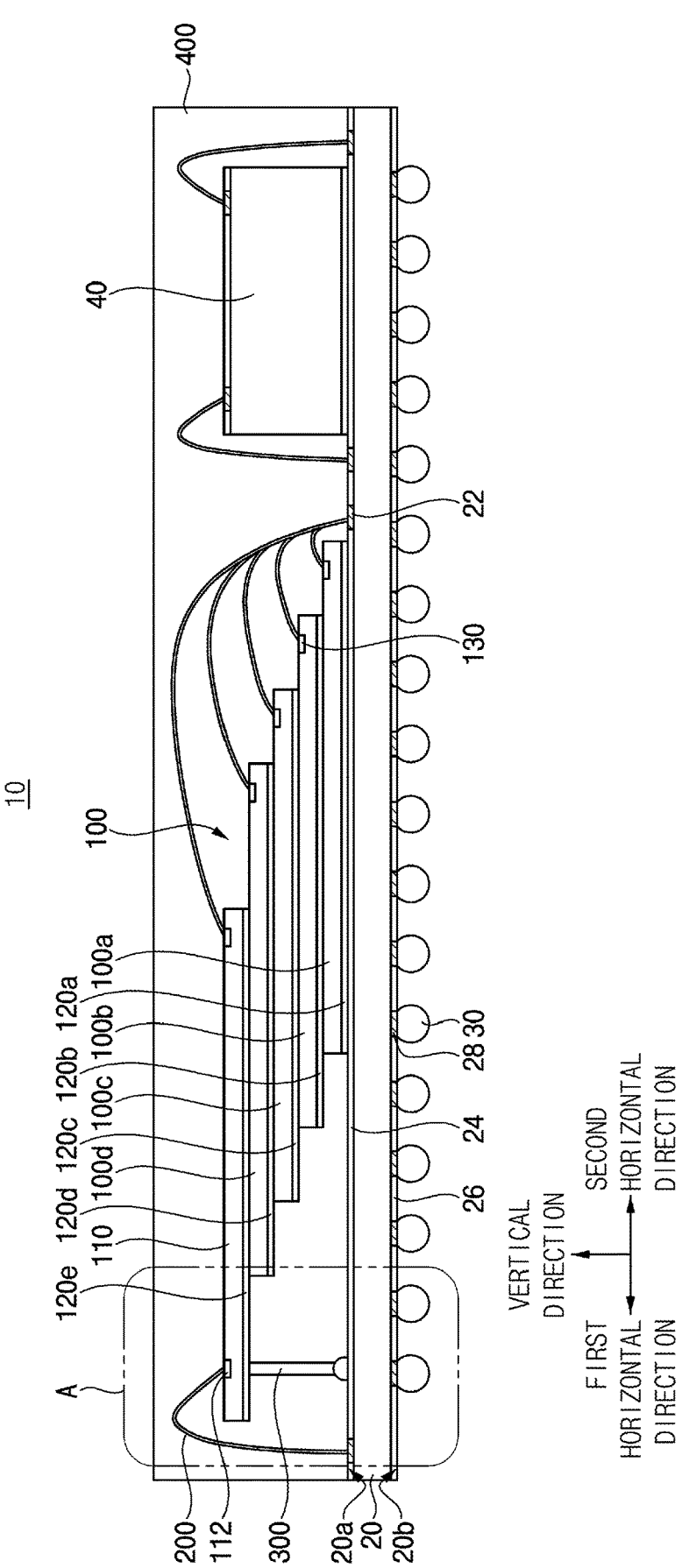
Figure 2:
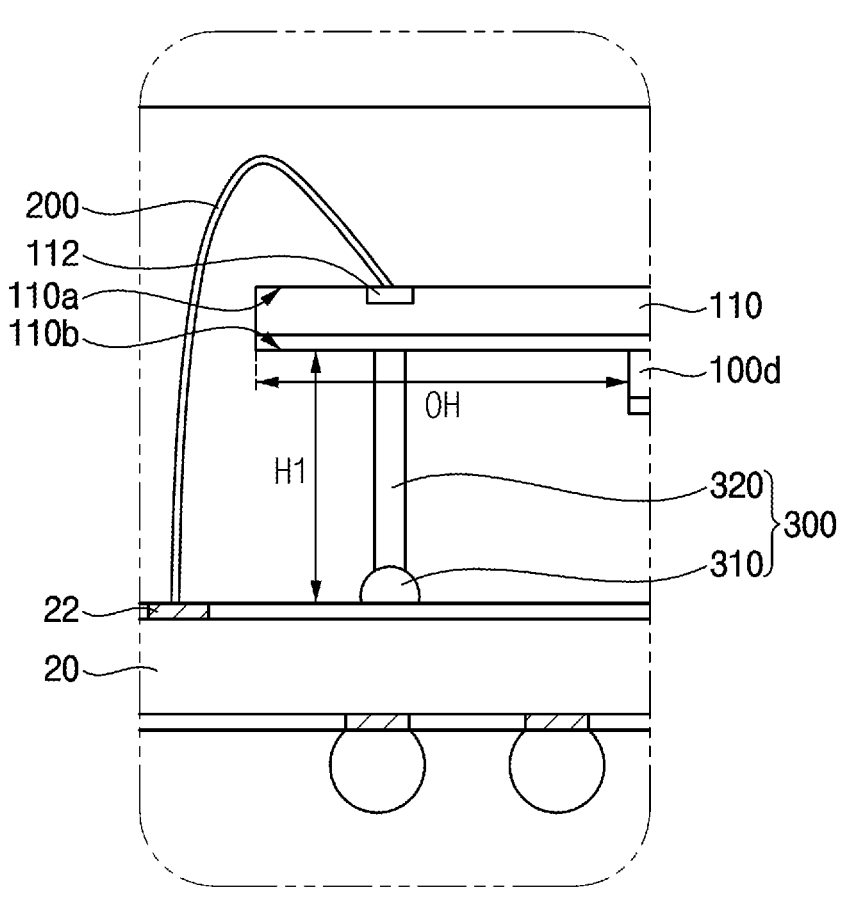
Figure 3:
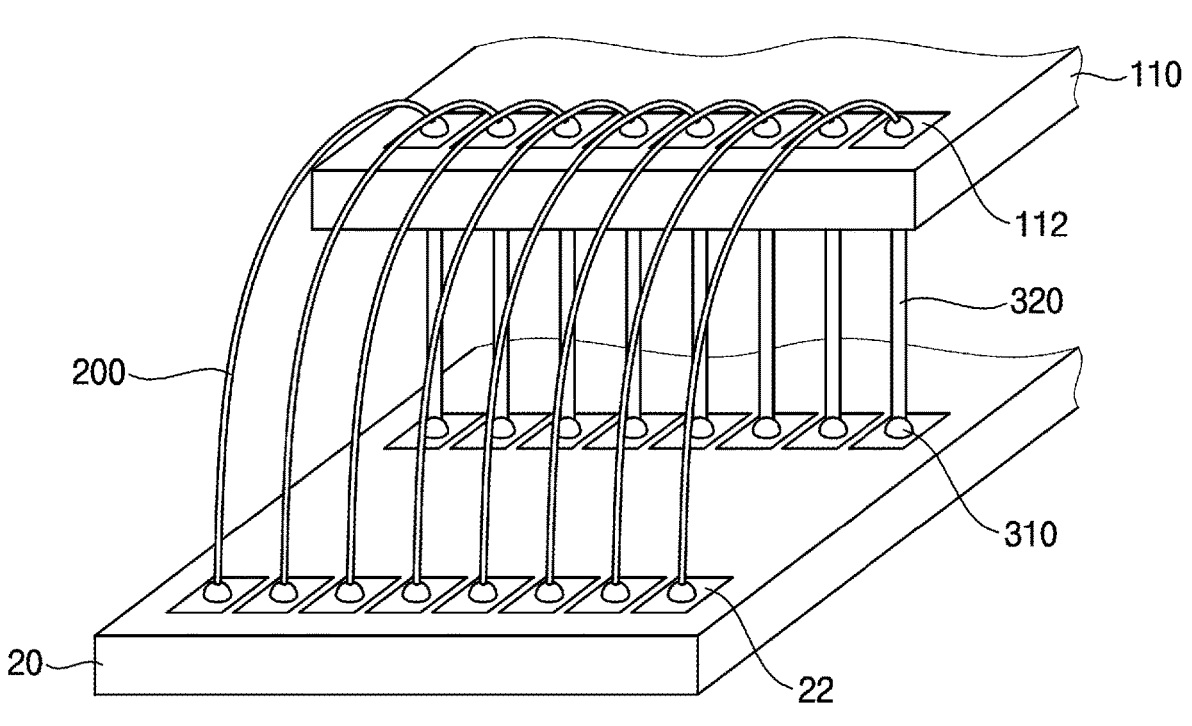

FIG. 1 is a cross-sectional view illustrating a semiconductor package in accordance with example embodiments. FIG. 2 is an enlarged cross-sectional view illustrating a portion 'A' in FIG. 1. FIG. 3 is an enlarged perspective view illustrating a portion 'A' in FIG. 1.

Referring to FIGS. 1 to 3, a semiconductor package 10 may include package substrate 20, a plurality of first semiconductor chips 100 stacked on the package substrate 20 in a stair-step configuration, conductive wires 200 that electrically connect the first semiconductor chips 100 to the package substrate 20, and a plurality of first support structures 300. The semiconductor package 10 may further include a sealing member 400. The semiconductor package 10 may further include an electronic device 40.

In example embodiments, the package substrate 20 may be a substrate having an upper surface 20a and a lower surface 20b opposite to each other. For example, the package substrate 20 may include a printed circuit board (PCB), a flexible substrate, a tape substrate, or the like. The printed circuit board may be a multilayer circuit board having vias and various circuits therein.

Substrate pads 22 may be disposed on the upper surface 20a of the package substrate 20 and may be respectively connected to a plurality of wirings. The wirings may extend inside or on the upper surface 20a of the package substrate 20. The substrate pads 22 may be respectively connected to ends of the wirings. For example, at least a portion of the wiring may be used as the substrate pad to serve as a landing pad.

The wirings may include a power wiring or a ground wiring as a power net for supplying power to electronic components mounted on the package substrate 20. The substrate pads 22 may include a power pad connected to the power wiring or a ground pad connected to the ground wiring. In addition, the substrate pads 22 may further include a plurality of substrate signal wirings and substrate signal pads for transmitting data signals to the electronic components.

Although only some substrates, some bonding pads, and some wirings are illustrated in the drawings, it may be understood that the number and arrangement of the substrates, the bonding pads, and the wirings are exemplary, and it may be not limited thereto. Since the wirings as well as the substrates are well known in the art to which the present inventive concept pertains, illustration and description concerning the above elements will be omitted.

A first insulating layer 24 may be formed on the upper surface 20a of the package substrate 20 to cover the wirings and to expose the substrate pads 22. The first insulating layer 24 may cover the entire upper surface 20a of the package substrate 20 except for the substrate pad 22. For example, the first insulating layer 24 may include a solder resist.

External connection pads 28 for providing electrical signals may be formed on the lower surface 20b of the package substrate 20. The external connection pads 28 may be exposed by a second insulating layer 26. The second insulating layer may include a silicon oxide layer, a silicon nitride layer, or a silicon oxynitride layer. An external connection member 30 for electrical connection with an external device may be disposed on the external connection pad 28 of the package substrate 20. For example, the external connection member 30 may be a solder ball. The semiconductor package 10 may be mounted on a module substrate (not shown) via the solder balls to constitute a memory module.

In example embodiments, the sealing member 400 may be formed on the package substrate 20 to protect the first semiconductor chips 100, the conductive wire 200, the electronic device 40 and the first support structures 300 from an external environment. The sealing member may include an epoxy mold compound (EMC).

In example embodiments, the plurality of first semiconductor chips 100 may be mounted on the package substrate 20. The plurality of first semiconductor chips 100 may be stacked on the package substrate 20 in a stair-step configuration, as illustrated in FIG. 1. The stacked first semiconductor chips 100 may have the stair-step configuration that extends to one side (i.e., in a first direction, such as the first horizontal direction shown in FIG. 1). The plurality of first semiconductor chips 100 may include an uppermost semiconductor chip 110 that is spaced apart from the package substrate 20 by a first height H1, as illustrated in FIG. 2.

In this specification, a direction in which the first semiconductor chips 100 are stacked in a stair-step configuration is referred to as a first horizontal direction, a horizontal direction opposite to the first horizontal direction is referred to as a second horizontal direction, and a direction orthogonal to the first horizontal direction and the second horizontal direction is referred to as a vertical direction.

For example, five first semiconductor chips 100a, 100b, 100c, 100d, 110 may be attached to the upper surface 20a of the package substrate 20 via respective first adhesive members 120a, 120b, 120c, 120d, 120e. For example, the first adhesive members may include an adhesive film such as a die adhesive film (DAF).

The first semiconductor chips 100 may each have first chip pads (bonding pads) 112 formed on an upper surface, that is, an active surface thereof. The first chip pads 130 may include an input/output terminal that performs a power pin function, an input/output terminal that performs a ground pin function, or an input/output terminal that performs a data pin function.

The first chip pads 130 may be redistribution pads. The first semiconductor chips 100 may each include a redistribution layer in an uppermost portion thereof. The redistribution layer may include the first chip pads 130. Although only some substrates, some bonding pads, and some wirings are illustrated in the drawings, it may be understood that the number and arrangement of the substrates, the bonding pads, and the wirings are exemplary, and it may be not limited thereto. Since the wirings as well as the substrates are well known in the art to which the present inventive concept pertains, illustration and description concerning the above elements will be omitted.

The first semiconductor chips 100 may each be electrically connected to the package substrate 20 by the conductive wires 200. For example, the first semiconductor chips 100 may be mounted on the package substrate 20 by a wire bonding method. In particular, the conductive wires 200 may electrically connect the first chip pads 130 of the first semiconductor chips 100 to the substrate pad 22 of the package substrate 20. For example, the conductive wires 200 may include bonding wires. Accordingly, the first semiconductor chips 100 may be stacked on the package substrate 20 by the first adhesive member and may be electrically connected to the package substrate 20 through the conductive wires 200.

The first semiconductor chips 100 may each include a memory chip including a memory circuit. For example, the first semiconductor chips 100 may each include a volatile memory device such as DRAM. It will be understood that the number, size, arrangement, etc. of the first semiconductor chips 100 are provided by way of example, and the present invention is not limited thereto.

In example embodiments, the electronic device 40 may be mounted on the package substrate 20. The electronic device 40 may be disposed on the package substrate 20 to be spaced apart from the first semiconductor chips 100, as illustrated in FIG. 1. The electronic device 40 may be electrically connected to the first semiconductor chips 100 through the package substrate 20. The electronic device 40 may be attached on the upper surface 20a of the package substrate 20 using an adhesive member. The electronic device 40 may include an integrated circuit. For example, the electronic device 40 may be a logic chip including a logic circuit. The logic chip may be a controller for controlling the memory chip.

In example embodiments, the uppermost semiconductor chip 110 may be a semiconductor chip stacked in an uppermost portion of the first semiconductor chips 100. The uppermost semiconductor chip 110 of the plurality of first semiconductor chips 100 may have a first upper surface 110a and a first lower surface 110b opposite to each other, as illustrated in FIG. 2. The first lower surface 110b of the uppermost semiconductor chip 110 may be spaced apart from the package substrate 20 by the first height H1. The uppermost semiconductor chip 110 may include a free end or overhang portion OH that extends outward from the underlying adjacent first semiconductor chip 100d in cantilever fashion, as illustrated, as illustrated in FIG. 2. There is no first semiconductor chip 100 between the free end/ overhang portion OH of the uppermost semiconductor chip 110 and the package substrate 20.

The uppermost semiconductor chip 110 may have first bonding pads 112 formed on the upper surface, that is, the active surface thereof. The first bonding pads 112 may include an input/output terminal that performs a power pin function, an input/output terminal that performs a ground pin function, or an input/output terminal that performs a data pin function.

The first bonding pads 112 may be redistribution pads. The uppermost semiconductor chip 110 may include the redistribution layer in the uppermost portion thereof. The redistribution layer may include the first bonding pads 112.

The uppermost semiconductor chip 110 may be electrically connected to the package substrate 20 by the conductive wires 200. For example, the uppermost semiconductor chip 110 may be mounted on the package substrate 20 by the wire bonding method. Specifically, the conductive wire 200 may electrically connect the first bonding pad 112 of the uppermost semiconductor chip 110 to the substrate pad 22 of the package substrate 20, as illustrated in FIG. 2. Accordingly, the first semiconductor chips 100 may be stacked on the package substrate 20 by the adhesive members and may be electrically connected to the package substrate 20 through the plurality of conductive wires 200.

The free end or overhang portion OH may be a cantilever structure protruding from the stair-step configuration of the first semiconductor chips 100. The first bonding pads 112 may be provided in the free end or overhang portion OH. For example, a length of the free end or overhang portion OH may be within a range of 200 m to 400 m. In a process of contacting and connecting the conductive wires 200 on the first bonding pads 112 provided in the free end or overhang portion OH, a force in the vertical direction may be applied to the first uppermost semiconductor chip 110.

In example embodiments, the first support structure 300 may be disposed on the package substrate 20. The first support structure 300 may be interposed between the package substrate 20 and the uppermost semiconductor chip 110 of the first semiconductor chips 100 to support the uppermost semiconductor chip 110. A height of the first support structure 300 may have the first height H1 the same as the distance from the package substrate 20 to the first lower surface 110b of the uppermost semiconductor chip 110.

Specifically, the first support structure 300 may include at least one first dummy pad 310 disposed on the package substrate 20, and a first dummy wire 320 having one end bonded to the first dummy pad 310 and supporting the first lower surface 110b of the first uppermost semiconductor chip 110. One end of the first dummy wire 320 may be bonded to the upper surface of the package substrate 20. An opposite end of the first dummy wire 320 may extend upward from the one end to contact a lower portion of the free end or overhang portion OH of the uppermost semiconductor chip 110. For example, the first dummy wire 320 may have an I-shape (i.e., an elongate linear shape) and support the overhang portion.

The first support structures 300 may be arranged adjacent to a side surface of the free end or overhang portion OH and under the free end or overhang portion OH (i.e., adjacent to the free end of the uppermost semiconductor chip 110). The first support structures 300 may be arranged to have a plurality of columns to support the lower portion of the free end or overhang portion OH. For example, the plurality of columns may be provided without limitation to support the lower surface of the free end or overhang portion OH.

For example, a plurality of the first dummy pads 310 may be arranged on the upper surface 20a of the package substrate 20. The plurality of first dummy pads 310 may be arranged along one direction. The plurality of first dummy pads 310 may be spaced apart from each other by a predetermined distance. One end of the first dummy wire 320 may be bonded to the first dummy pad 310. The first dummy wire 320 may extend upward from the one end to have the first height H1 capable of supporting the free end or overhang portion OH of the first uppermost semiconductor chip 110.

The plurality of first dummy pads 310 may be provided on the package substrate 20 at positions corresponding to the first bonding pads 112 of the uppermost semiconductor chip 110. The plurality of first dummy pads 310 may be arranged at any desired positions on the upper surface of the package substrate 20. In addition, each of the first dummy wires 320 connected to the plurality of first dummy pads 310 may have the first height H1 determined according to a height of the free end or overhang portion OH of the uppermost semiconductor chip 110 from the upper surface 20a of the package substrate 20.

The plurality of first dummy wires 320 may respectively extend from the first dummy pads 310 in the vertical direction. The plurality of first dummy wires 320 may respectively extend in the vertical direction from the first dummy pads 310 at positions corresponding to the first bonding pads 112 of the uppermost semiconductor chip 110. The first dummy wires 320 may extend in the vertical direction to support the free end or overhang portion OH of the uppermost semiconductor chip 110 during the process of connecting the first bonding pads 112 and the conductive wires 200 of the uppermost semiconductor chip 110.

The predetermined distance between the plurality of first dummy pads 310 and a diameter of the first dummy wire 320 may be determined in consideration of the length or thickness of the free end or overhang portion OH of the uppermost semiconductor chip 110. For example, the diameter of the first dummy wire 320 may be within a range of 1.0 mm to 3.5 mm.

The first dummy wire 320 may have a thickness equal to or greater than that of the conductive wire 200. The first dummy wire 320 may be formed of a material having excellent strength and high thermal conductivity. For example, the first dummy wire 320 may be formed of a same material as the conductive wire 200. Alternatively, the first dummy wire 320 may be formed of a non-conductive material.

For example, the first dummy wire 320 may include copper (Cu), aluminum (Al), tungsten (W), nickel (Ni), molybdenum (Mo), gold (Au), silver (Ag), chromium (Cr), tin (Sn), titanium (Ti), etc.

The dummy pad 310 may be formed of a same material as the chip pad 112. Alternatively, the dummy pad 310 may be attached to the package substrate 20 with a non-conductive adhesive film interposed therebetween. An example of the non-conductive adhesive film may be a polyimide film.

Hereinafter, a method of manufacturing the semiconductor package in FIG. 1 will be explained.

Figure 4:
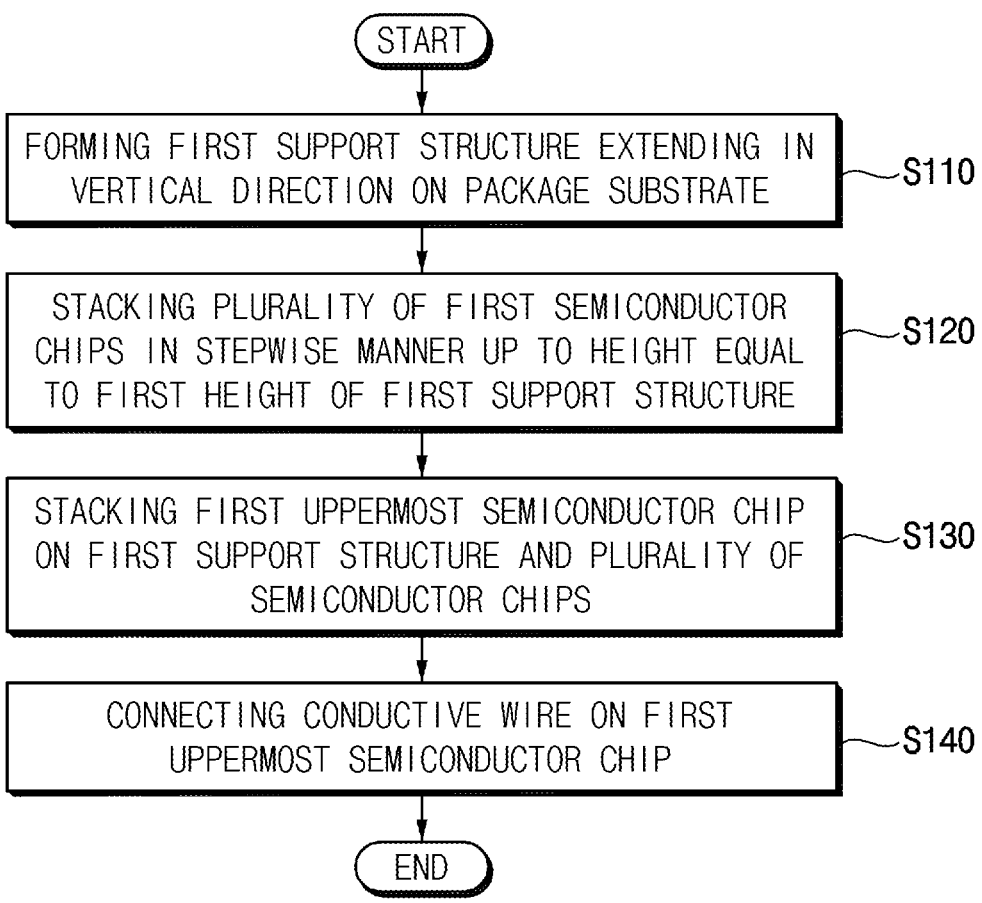
Figure 5:
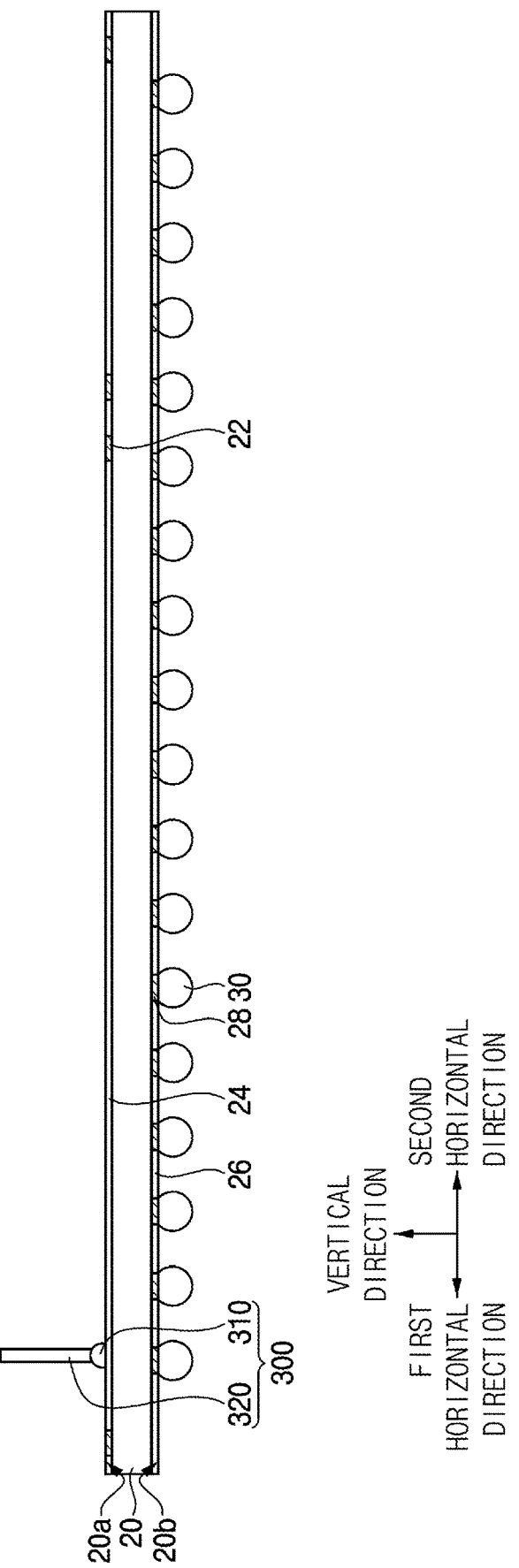

FIG. 4 is a flowchart illustrating a method of manufacturing a semiconductor package in accordance with example embodiments. FIGS. 5 to 12 are cross-sectional views illustrating a method of manufacturing a semiconductor package in accordance with example embodiments.

Referring to FIGS. 4 to 12, first, a first support structure 300 extending in a vertical direction may be formed on a package substrate 20 (S110).

In example embodiments, the first support structure 300 may be disposed on the package substrate 20. The first support structure 300 may be formed during a wire bonding process.

Figure 6:
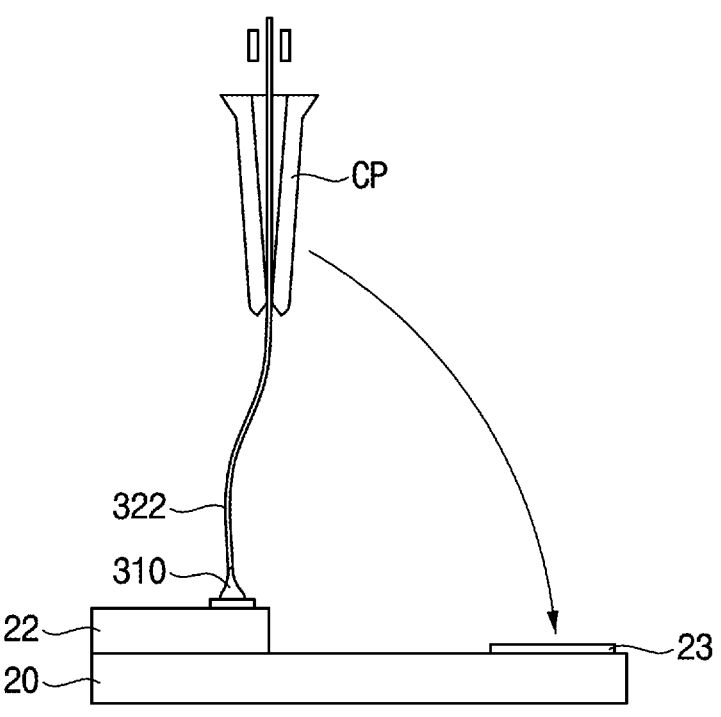

As illustrated in FIG. 6, a conductive material 322 may be extended to have a predetermined length L from the package substrate 20 to contact a contact pad 23.

The conductive material 322 may be drawn from a capillary CP. The conductive material 322 may be extended from a substrate pad 22 formed on the package substrate 20. The extended conductive material 322 may contact the contact pad 23. The contact pad 23 may be a conductive pad formed in a semiconductor package 10 that is used to form the first support structure 300. Alternatively, the conductive material 322 may be extended from the package substrate 20 to contact any point on the package substrate 20.

The conductive material 322 may include a same material as conductive wires 200 that electrically connect the semiconductor package 10 and first semiconductor chips 100.

The conductive material 322 may include copper (Cu), aluminum (Al), tungsten (W), nickel (Ni), molybdenum (Mo), gold (Au), silver (Ag), chromium (Cr), tin (Sn), titanium (Ti), etc.

Figure 7:
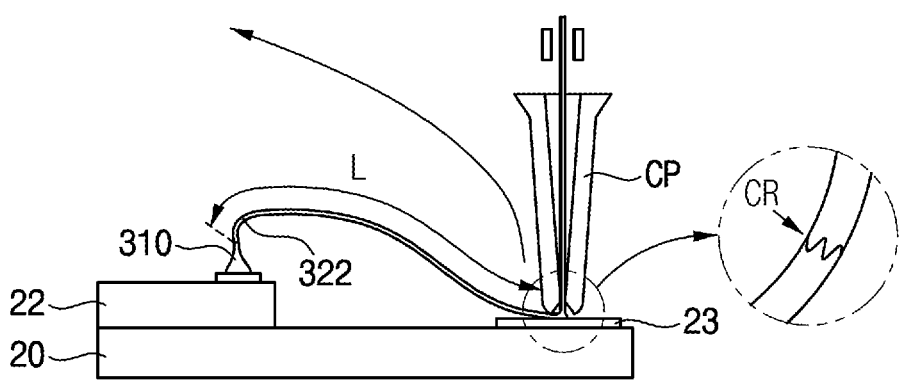

As illustrated in FIG. 7, when a stitch operation is performed in a state in which the conductive material 322 is not attached on the contact pad 23, a scratch portion CR may be formed in the conductive material 322.

While the conductive material 322 is drawn from the capillary CP, the scratch portion CR may be formed on the conductive material 322 through the stitch operation. The stitch operation may be performed when the conductive material 322 is drawn from the capillary CP by the predetermined length L.

Figure 8:
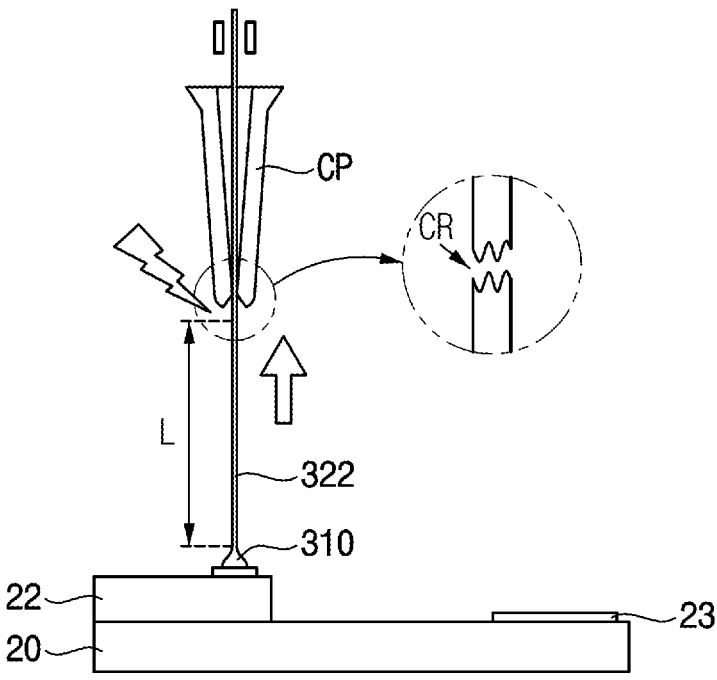

As illustrated in FIG. 8, the conductive material 322 may be erected in a vertical direction orthogonal to the package substrate 20, the first support structure 300 may be formed by cutting the scratch portion CR of the conductive material 322.

The conductive material 322 may be cut by moving the capillary CP from the substrate pad 22 in the vertical direction. The conductive material 322 may be cut at the scratch portion CR. The first support structure 300 may be formed while the conductive material 322 is cut. The first support structure 300 may have a first height H1 equal to the predetermined length L.

Then, the plurality of first semiconductor chips 100 may be stacked in a stepwise manner up to the same height as the first height H1 of the first support structure 300 (S120).

Figure 9:
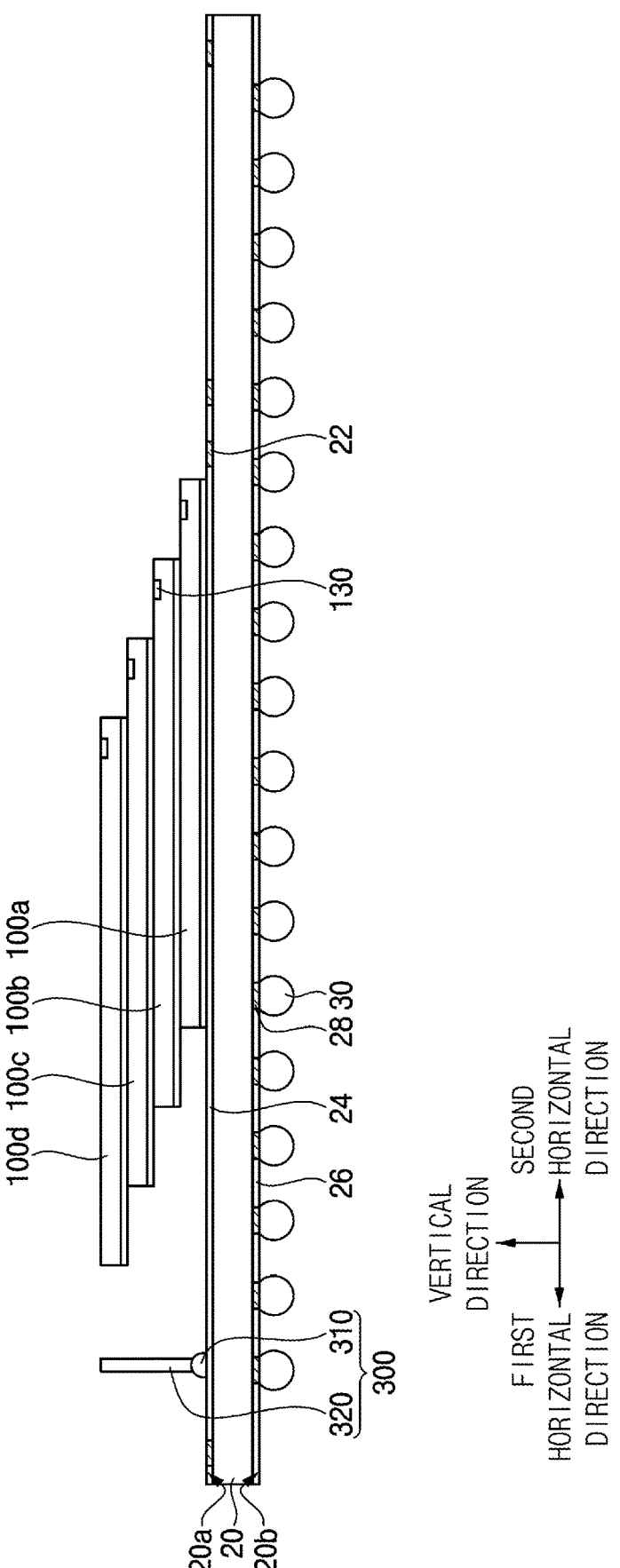

In example embodiments, as illustrated in FIG. 9, the plurality of first semiconductor chips 100 may be stacked on the package substrate 20 in a stair-step configuration. The stacked first semiconductor chips 100 may have a stair-step configuration that extends to one side (i.e., in a first direction, such as the first horizontal direction shown in FIG. 9).

For example, the four first semiconductor chips 100a, 100b, 100c, 100d may be stacked on an upper surface 20a of the package substrate 20 using first adhesive members 120a, 120b, 120c, 120d. For example, the first adhesive member may include an adhesive film such as a die adhesive film (DAF).

Then, an uppermost semiconductor chip 110 may be stacked on the first support structure 300 and the plurality of first semiconductor chips 100 (S130).

In example embodiments, the uppermost semiconductor chip 110 may be a semiconductor chip stacked in an uppermost portion of the first semiconductor chips 100. A first lower surface 110b of the uppermost semiconductor chip 110 may be spaced apart from the package substrate 20 by the first height H1. Since the first lower surface 110b of the uppermost semiconductor chip 110 is spaced apart from the package substrate 20 by the first height H1, the uppermost semiconductor chip 110 may be supported by the first support structure 300.

Figure 10:
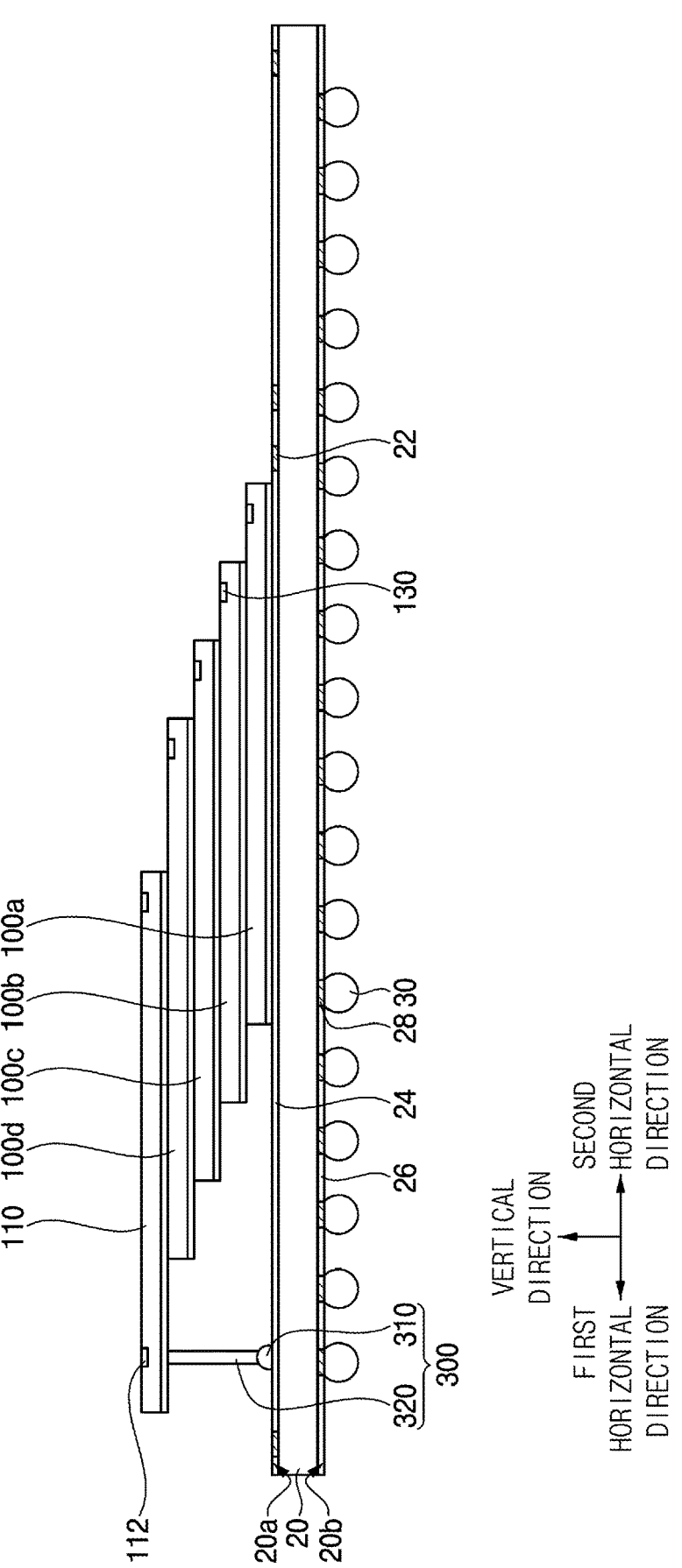

As illustrated in FIG. 10, the uppermost semiconductor chip 110 may include a free end or overhang portion OH that extends outward from the first semiconductor chips 100 in cantilever fashion. The first bonding pads 112 may be formed in the free end or overhang portion OH. The first bonding pads 112 may be formed at a same position as a first dummy pad 310 of the first support structure 300 in the vertical direction, as illustrated in FIG. 10.

Then, the conductive wire 200 may be connected on the uppermost semiconductor chip 110, and a sealing member 400 may be formed to complete the semiconductor package 10 of FIG. 1 (S140).

In example embodiments, the conductive wire 200 may electrically connect the first bonding pad 112 of the uppermost semiconductor chip 110 to the substrate pad 22 of the package substrate 20. The sealing member 400 may be formed on the package substrate 20 to protect the first semiconductor chips 100, the conductive wire 200, and the first support structures 300 from an external environment. The sealing member may include an epoxy mold compound (EMC).

Figure 11:
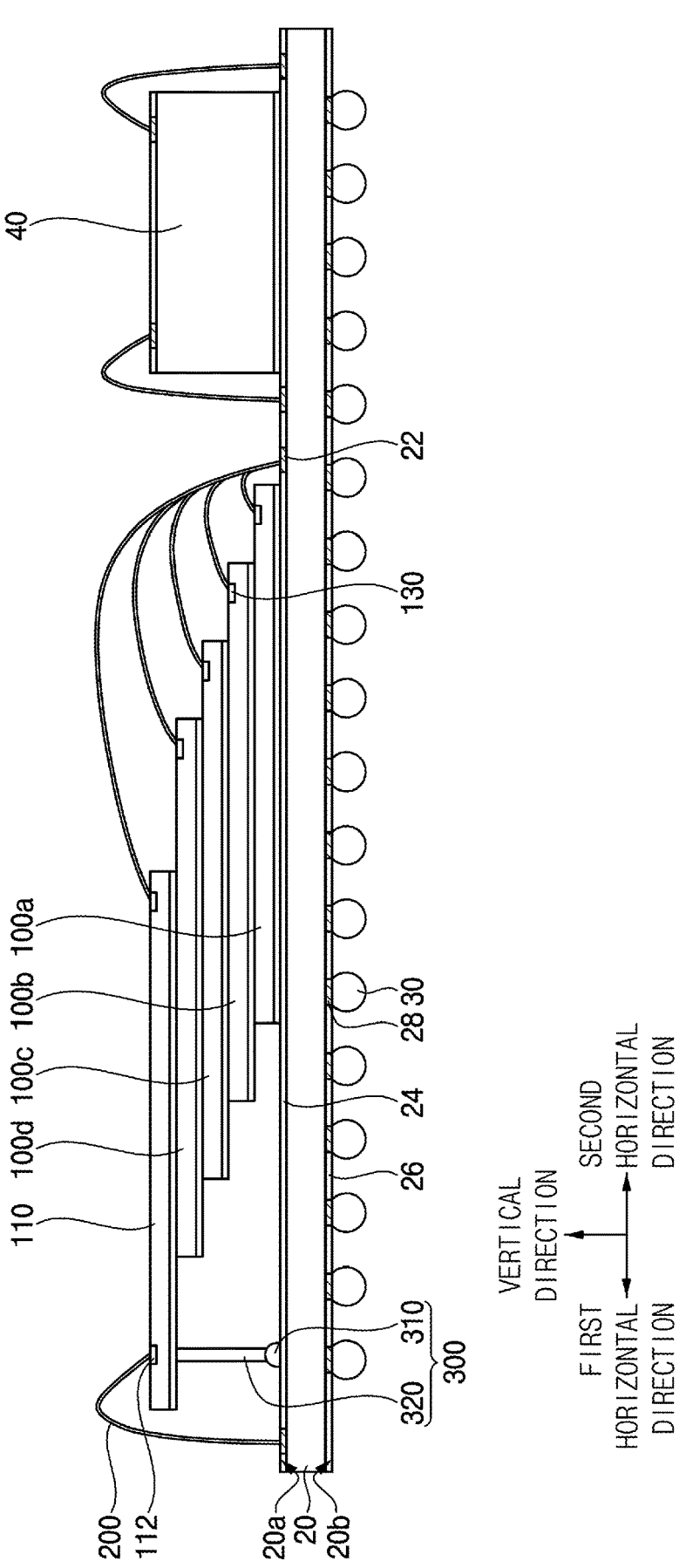
Figure 12:
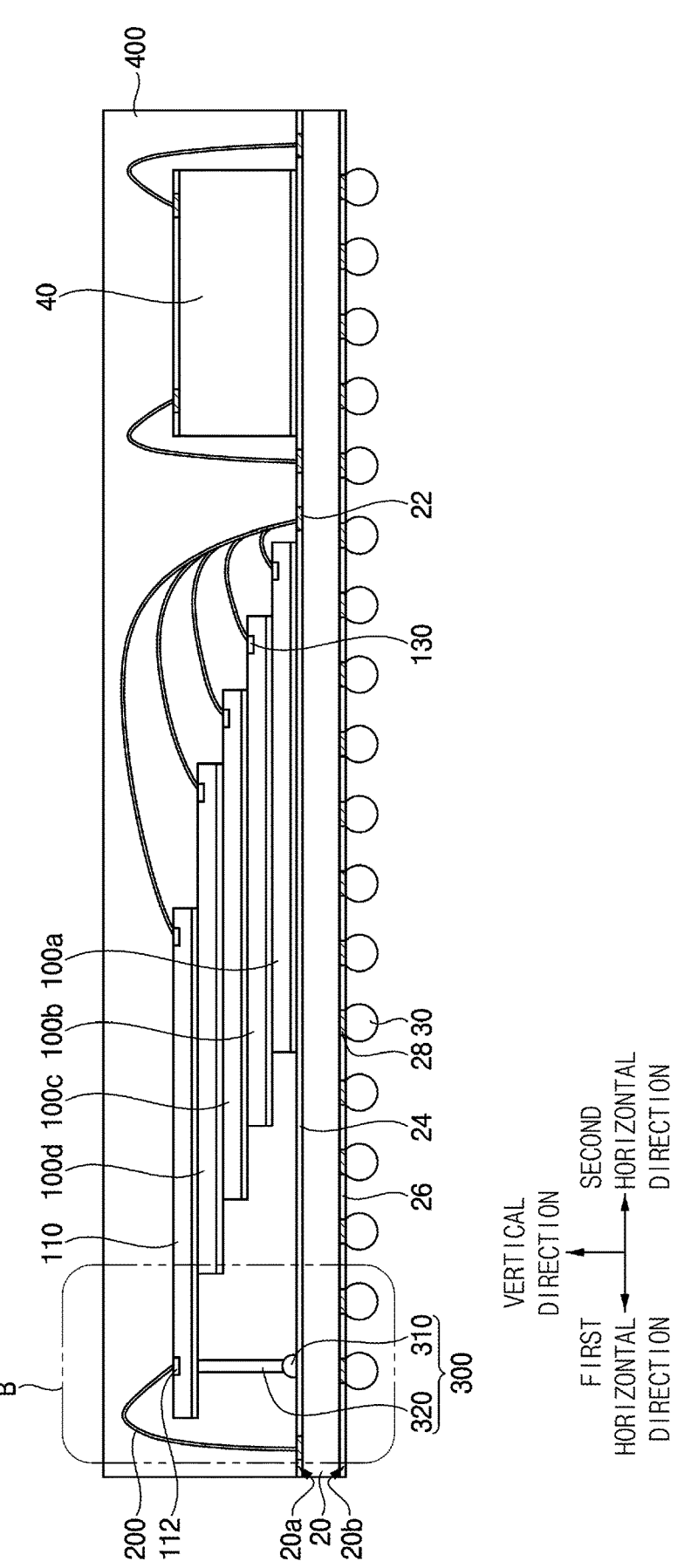

As illustrated in FIGS. 11 and 12, the uppermost semiconductor chip 110 may receive a force in the vertical direction during the process of contacting and connecting the conductive wires 200 on the first bonding pads 112 provided in the free end or overhang portion OH. The first support structures 300 may resist the force acting in the vertical direction. Since the first support structures 300 are formed under the first bonding pads 112, the first support structures 300 may effectively resist the vertical force exerted on the uppermost semiconductor chip 110.

Figure 13:
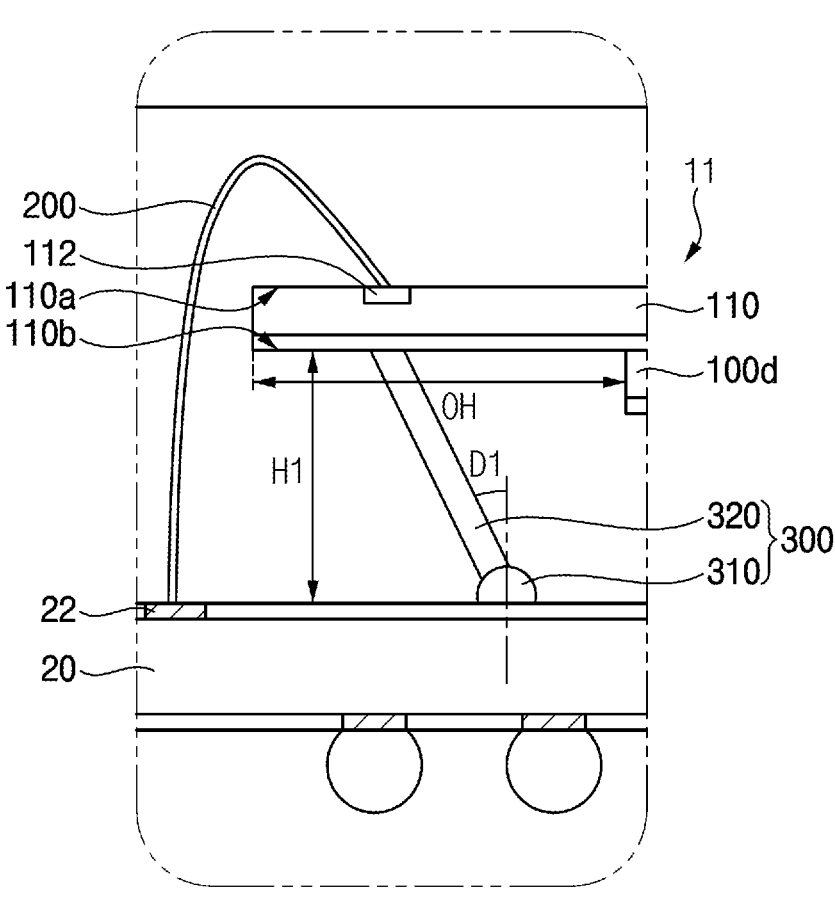
Figure 14:
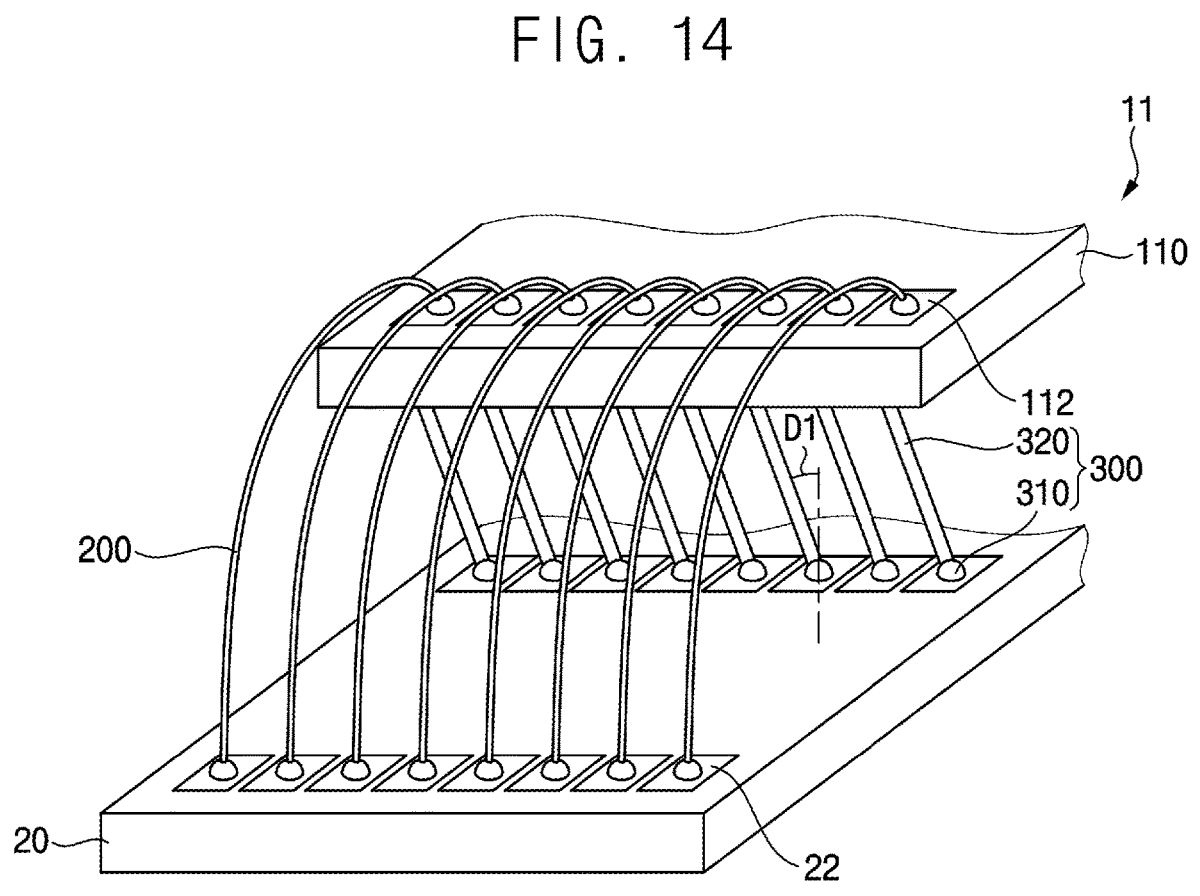

FIGS. 13 to 19 are views illustrating semiconductor packages having first support structures in accordance with example embodiments. FIG. 13 is enlarged cross-sectional view illustrating a portion 'B' in FIG. 12 when support structures have a predetermined inclination. FIG. 14 is enlarged perspective view illustrating a portion 'B' in FIG. 12 when support structures have a predetermined inclination.

Referring to FIGS. 13 and 14, in the step S110 of forming the first support structure 300, the first support structure 300 may be formed to be inclined at a predetermined inclination angle relative to the package substrate 20 and the uppermost semiconductor chip 110. The first support structure 300 may have the predetermined inclination angle from the vertical direction (i.e., the first support structure 300 may define an angle D1 relative to the vertical direction).

In example embodiments, in the step S110 of forming the first support structure 300, the conductive material 322 may be drawn from the capillary CP and extended to have the predetermined length L from the package substrate 20 to contact the contact pad 23, a scratch portion CR may be formed in the conductive material 322 by performing a stitch operation in a state where the conductive material 322 is not attached on the contact pad 23, the conductive material 322 may be erected to be inclined at the predetermined inclination angle from the vertical direction orthogonal to the package substrate 20, and the scratch portion CR of the conductive material 322 may be cut to form the first support structure 300.

Each of first dummy wires 320 of a semiconductor package 11 may extend in the vertical direction with a predetermined first inclination angle D1. The first inclination angle D1 may be a slope inclined toward a stacking direction (a first horizontal direction) of the stepwise manner of the first semiconductor chips 100. The first dummy wires 320 may be inclined in a direction in which the uppermost semiconductor chip 110 protrudes from the first semiconductor chips 100. For example, the first inclination angle D1 may be within a range of 0 degrees to 20 degrees.

Figure 15:
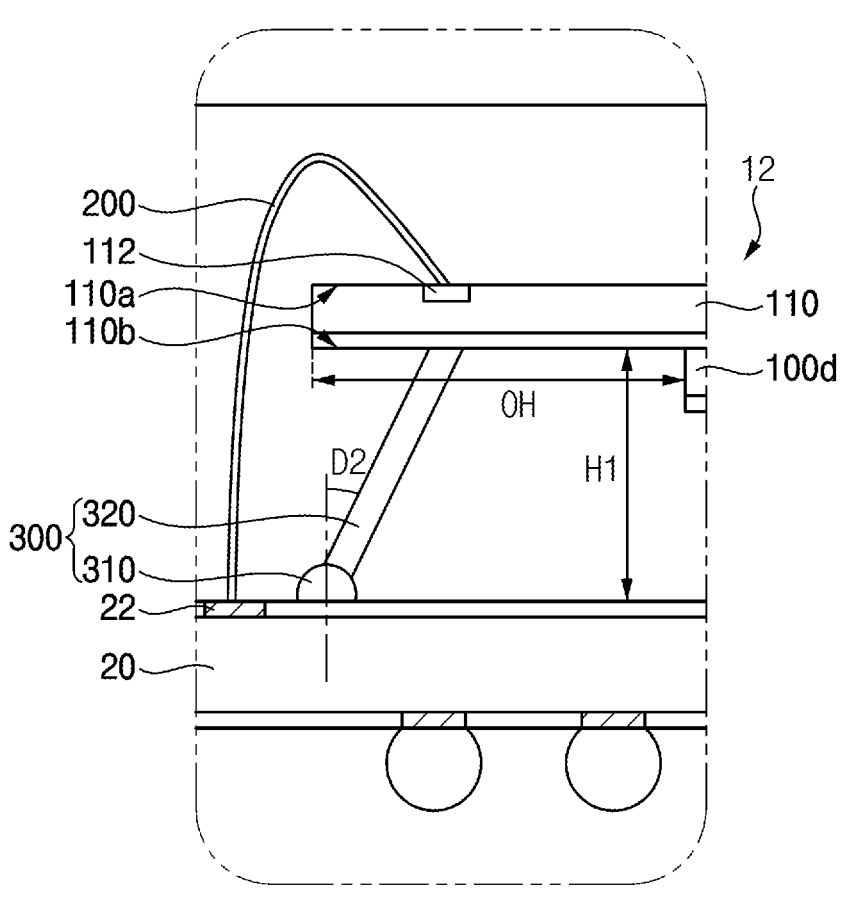
Figure 16:
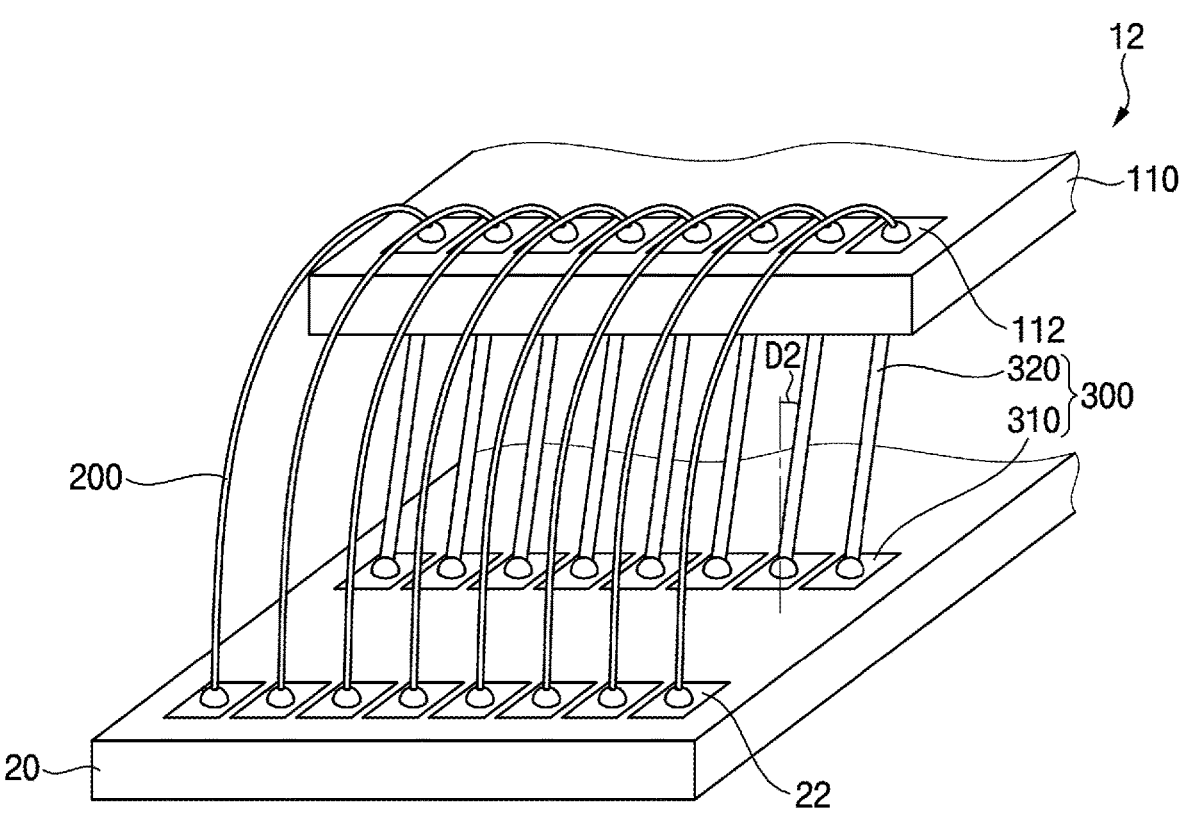

FIG. 15 is an enlarged cross-sectional view illustrating a portion 'B' in FIG. 12 when support structures have a predetermined inclination. FIG. 16 is enlarged perspective view illustrating a portion 'B' in FIG. 12 when support structures have a predetermined inclination.

Referring to FIGS. 15 and 16, each of the first dummy wires 320 of a semiconductor package 12 may extend in the vertical direction with a predetermined second inclination angle D2. The second inclination angle D2 may be a slope inclined toward a direction (the second horizontal direction) opposite to the stacking direction of the stepwise manner of the first semiconductor chips 100. The first dummy wires 320 may be inclined in the direction opposite to the direction in which the uppermost semiconductor chip 110 protrudes from the first semiconductor chips 100. For example, the second inclination angle D2 may be within a range of 0 degrees to 20 degrees.

Figure 17:
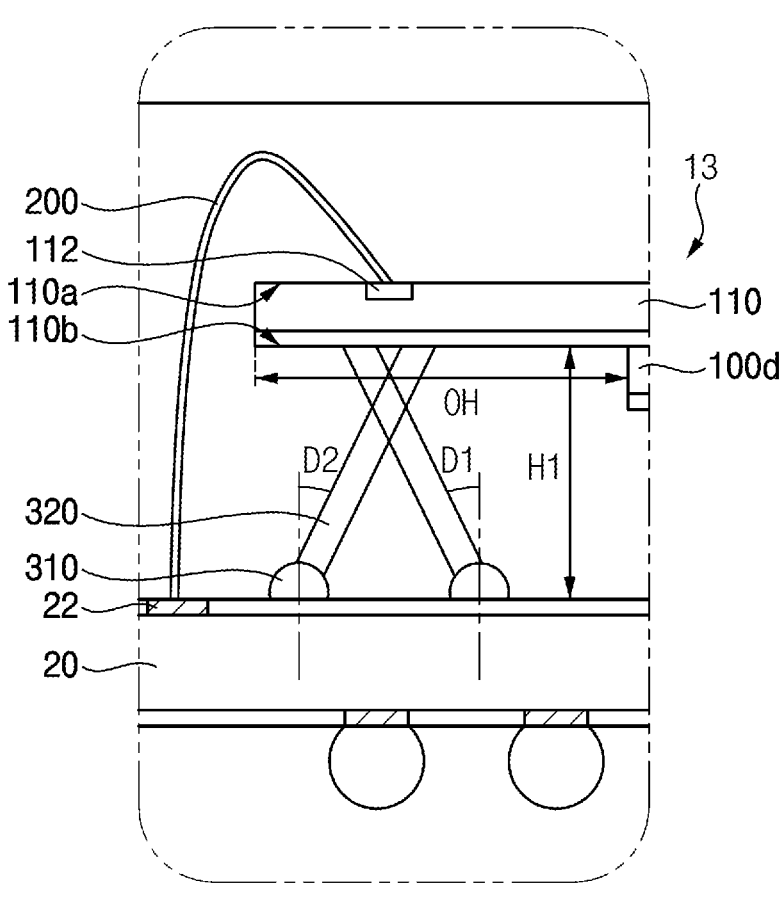
Figure 18:
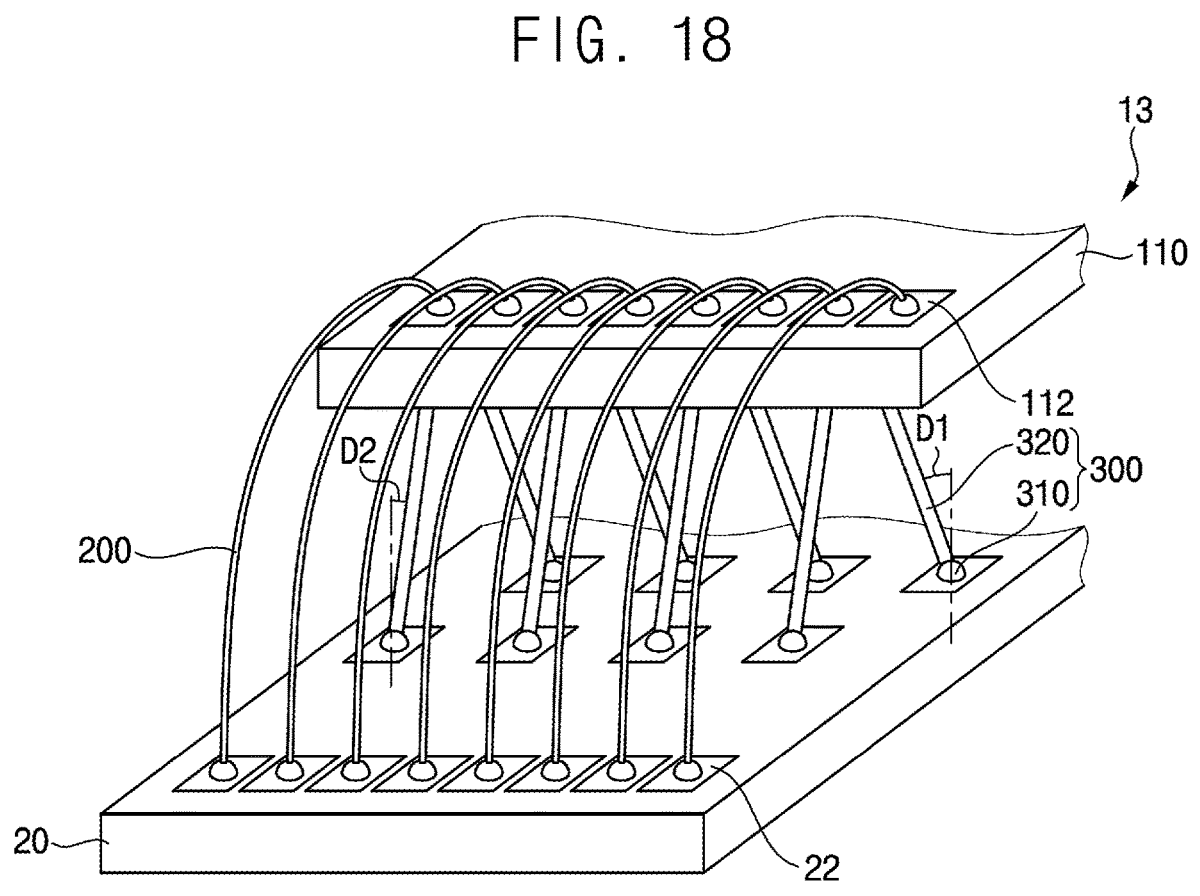

FIG. 17 is enlarged cross-sectional view illustrating a portion 'B' in FIG. 12 when support structures have a predetermined inclination angle. FIG. 18 is enlarged perspective view illustrating a portion 'B' in FIG. 12 when support structures have a predetermined inclination angle.

Referring to FIGS. 17 and 18, each of the first dummy wires 320 of a semiconductor package 13 may extend in the vertical direction with the predetermined inclination angles. The first dummy wires 320 may be inclined at an angle opposite to that of adjacent dummy wires, as illustrated. The first dummy wires 320 may cross and incline in opposite directions to adjacent dummy wires. The first dummy wires 320 may be inclined with the first and second inclination angles D1 and D2. For example, the first and second inclination angles D1 and D2 may be within a range of 0 degrees to 20 degrees.

Figure 19:
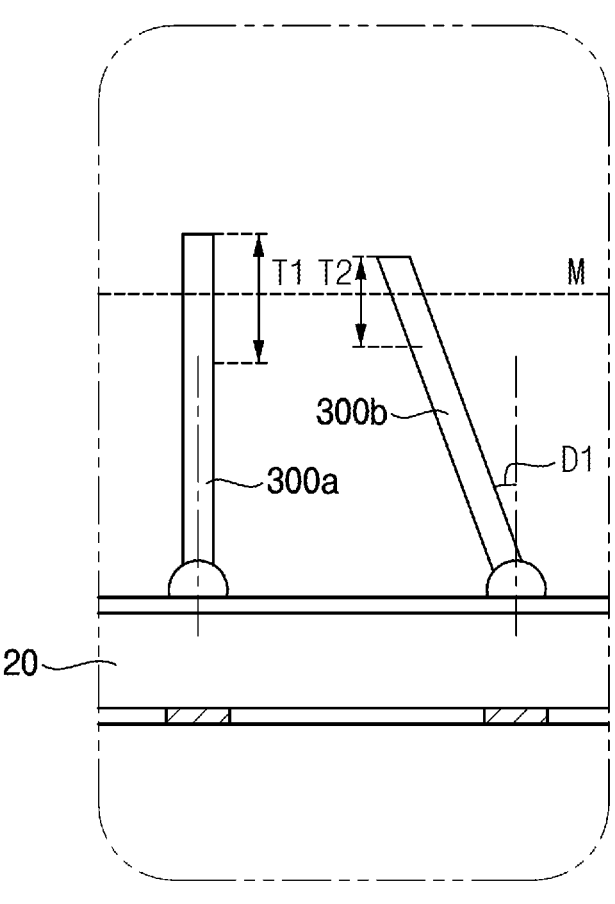

FIG. 19 is an enlarged perspective view illustrating a portion 'B' in FIG. 12 when support structures have different height deviations.

Referring to in FIG. 19, when the first support structure 300a extends vertically from the upper surface of the package substrate 20, the first support structure 300a may have a first height tolerance T1. When the first support structure 300b extends in the vertical direction with the predetermined inclination angle D1 from the upper surface of the package substrate 20, the first support structure 300b may have a second height tolerance T2.

The first support structure 300 may extend toward a target point M where the first uppermost semiconductor chip 110 is disposed. As the first and second height tolerances T1 and T2 of the first supporting structures 300a and 300b are closer to the target point M, the first support structure 300 may stably and efficiently support the uppermost semiconductor chip 110.

The first support structure 300a extending vertically during the process of forming the first support structure 300 may have a shorter predetermined length L from the target point M than the first support structure 300b having the predetermined inclination angle. A first height tolerance T1 of the vertically extending first support structure 300a may be greater than the second height tolerance T2 of the first support structure 300b having the predetermined inclination angle D1. The first support structure 300b having the predetermined inclination angle D1 may stably and efficiently support the first uppermost semiconductor chip 110 through the shorter height tolerance than the vertically extended first support structure 300a.

Figure 20:
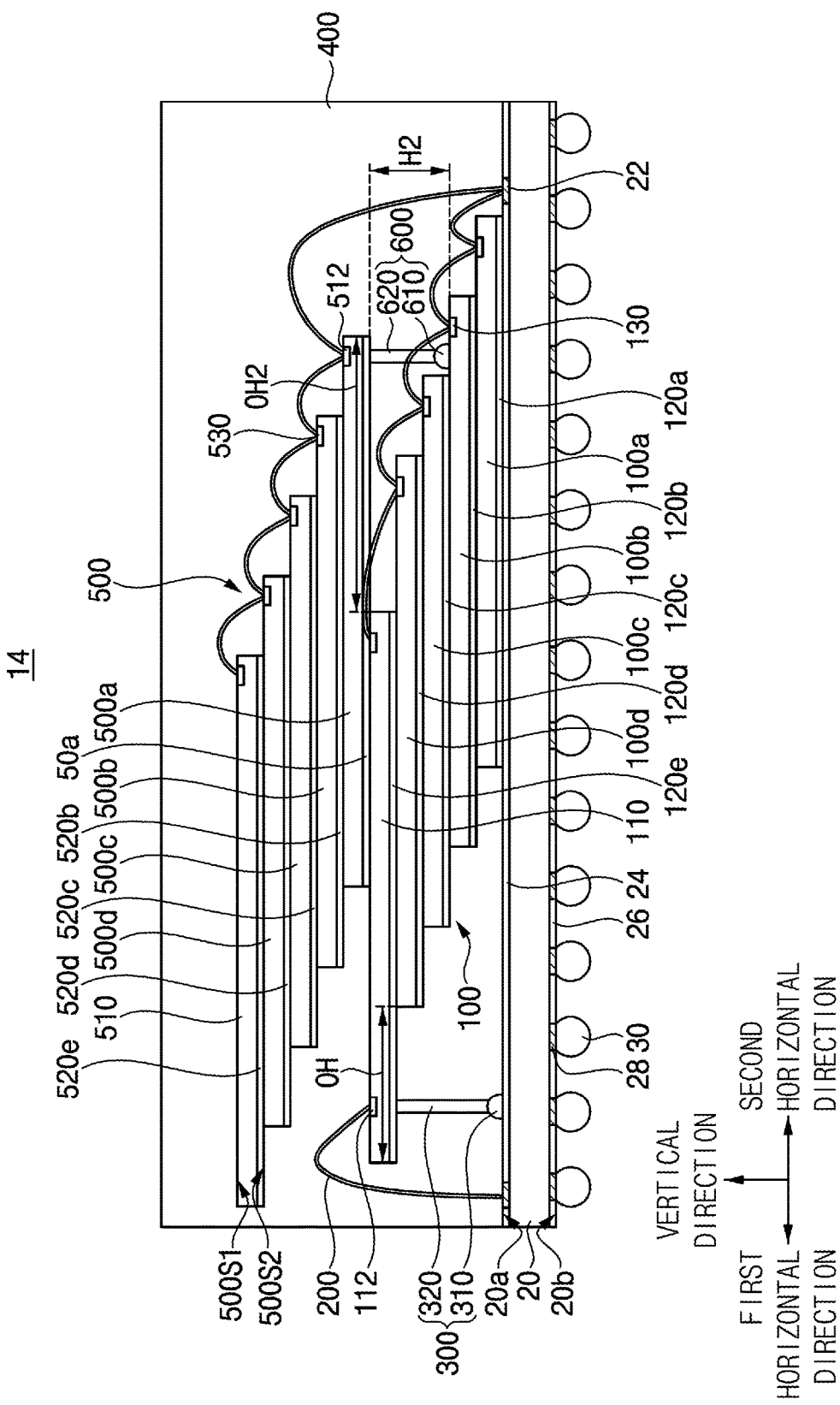
Figure 21:
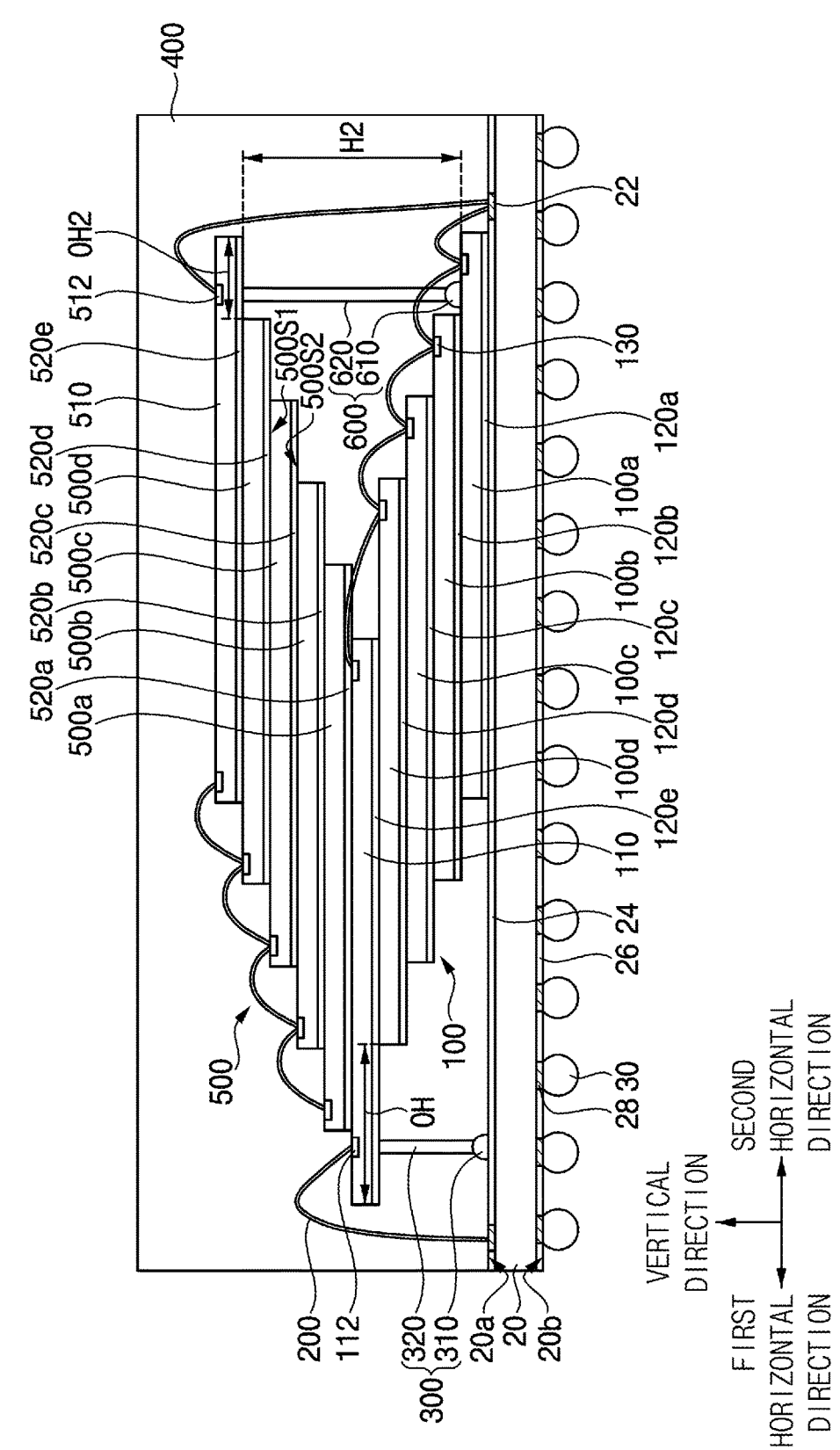

FIG. 20 is a cross-sectional view illustrating a semiconductor package 14 including support structures supporting lower surfaces of additional semiconductor chips in accordance with example embodiments. FIG. 21 is a cross-sectional view illustrating a semiconductor package 15 including support structures supporting an uppermost semiconductor chip of additional semiconductor chips in accordance with example embodiments. The semiconductor package may be substantially the same as or similar to the semiconductor package described with reference to FIGS. 1 to 3 except for a configuration of additional semiconductor chips. Thus, same or similar components are denoted by the same or similar reference numerals, and repeated descriptions of the same components will be omitted.

Referring to FIGS. 20 and 21, each of semiconductor packages 14, 15 may include package substrate 20, a plurality of first semiconductor chips 100 disposed on the package substrate 20, a plurality of second semiconductor chips 500 disposed on the first semiconductor chips 100, conductive wires 200 for electrically connecting the first and second semiconductor chips 100, 500 to the package substrate 20, a plurality of first supporting structures 300, and a plurality of second support structures 600. In addition, the semiconductor packages 14, 15 may further include a sealing member 400.

For example, the five second semiconductor chips 500a, 500b, 500c, 500d, 510 may be attached to the uppermost semiconductor chip 110 of the first semiconductor chips 100 through second adhesive members 520a, 520b, 520c, 520d, 520e. For example, the second adhesive member may include the adhesive film such as a direct adhesive film (DAF).

The second semiconductor chips 500 may each have second chip pads 530 formed on the upper surface, that is, the active surface. The second chip pads 530 may include an input/output terminal performing a power pin function, an input/output terminal performing a ground pin function, or an input/output terminal performing a data pin function. The second chip pads 530 may be the redistribution pads. The second semiconductor chips 500 may each include a redistribution layer on an uppermost portion. The redistribution layer may include second chip pads 530.

The second semiconductor chips 500 may be electrically connected to the package substrate 20 by the conductive wires 200. For example, the second semiconductor chips 500 may be mounted on the first semiconductor chips 100 by the wire bonding method. Specifically, the conductive wire 200 may electrically connect the second chip pad 530 of the second semiconductor chips 500 to the substrate pad 22 of the package substrate 20. For example, the conductive wire 200 may include a bonding wire. Accordingly, the second semiconductor chips 500 may be stacked on the first semiconductor chips 100 using the second adhesive members 520a-520e, and may be electrically connected to the package substrate 20 through the plurality of conductive wires 200.

As illustrated in FIG. 20, at least one of the second semiconductor chips 500 may be disposed on the uppermost semiconductor chip 110 of the first semiconductor chips 100 to protrude from one side of the uppermost semiconductor chip 110. The second semiconductor chip 500 on the uppermost semiconductor chip 110 of the first semiconductor chips 100 may include a second free end or overhang portion OH2 protruding from the first semiconductor chips 100, as illustrated.

Second bonding pads 512 may be provided in the second free end or overhang portion OH2. For example, a length of the second free end or overhang portion OH2 may be within a range of 200 m to 400 m. The second semiconductor chip 500 on the uppermost semiconductor chip 110 of the first semiconductor chips 100 may receive a force in the vertical direction in the process of contacting and connecting the conductive wires 200 on the second bonding pads 512 provided in the second free end or overhang portion OH2.

In example embodiments, the second support structure 600 may be disposed on one of the first semiconductor chips 100. For example, in the illustrated embodiment, the second support structure 600 is attached to first semiconductor chip 100b. The second support structure 600 may be disposed between the first semiconductor chip 100b and the second semiconductor chip 500a to support the second semiconductor chip 500a.

Specifically, the second support structure 600 may include at least one second dummy pad 610 disposed on the first semiconductor chip 100b, and a second dummy wire 620 having one end bonded to the second dummy pad 610 and supporting a second lower surface 500b of the second semiconductor chip 500a. The one end of the second dummy wire 620 may be bonded to the upper surface of the first semiconductor chip 100b. Another end of the second dummy wire 620 may extend upwardly from the one end to contact a lower portion of the second free end or overhang portion OH2 of the second semiconductor chip 500a. For example, the second dummy wire 620 may have an I-shape (i.e., an elongate linear shape) and support the second free end or overhang portion OH2.

For example, the diameter of the second dummy wire 620 may be within a range of 1.0 mm to 3.5 mm. The second dummy wire 620 may include copper (Cu), aluminum (Al), tungsten (W), nickel (Ni), molybdenum (Mo), gold (Au), silver (Ag), chromium (Cr), tin (Sn) and titanium (Ti).

As illustrated in FIG. 21, a plurality of second semiconductor chips 500 (e.g., 500a-500d and 510) may be mounted on the first semiconductor chips 100. The plurality of second semiconductor chips 500 may be stacked on the first semiconductor chips 100 in a stair-step configuration, as illustrated. The stair-step configuration may extend to one side, as illustrated. For example, the plurality of second semiconductor chips 500 may have a stair-step configuration that extends in the second horizontal direction opposite to the first horizontal direction in which the first semiconductor chips 100 are stacked in a stair-step configuration.

The plurality of second semiconductor chips 500 may include an uppermost semiconductor chip 510 spaced apart from any one of the first semiconductor chips 100 with a second height H2. The uppermost semiconductor chip 510 of the plurality of second semiconductor chips 500 may have a second upper surface 500s1 and a second lower surface 500s2 opposite to each other. The second lower surface 500s2 of the uppermost semiconductor chip 510 may be spaced apart from any one of the first semiconductor chips 100 by the second height H2. The uppermost semiconductor chip 510 of the plurality of second semiconductor chips 500 may include the second free end or overhang portion OH2 protruding from the second semiconductor chips 500, as illustrated.

The plurality of second dummy pads 610 may be provided on the first semiconductor chip 100a at positions corresponding to the second bonding pads 512 of the uppermost semiconductor chip 510. The plurality of second dummy pads 610 may be arranged at any desired positions on the upper surface of the first semiconductor chip 100a. In addition, each of the second dummy wires 620 connected to the plurality of second dummy pads 610 may have a second height H2 selected according to a height difference in the second free end or overhang portion OH2 of the second uppermost semiconductor chip 510 from the upper surface of the first semiconductor chip 100a.

The plurality of second dummy wires 620 may each extend from the second dummy pads 610 in the vertical direction. The plurality of second dummy wires 620 may extend in the vertical direction from the second dummy pads 610 at positions corresponding to the second bonding pads 512 of the uppermost semiconductor chip 510 of the plurality of second semiconductor chips 500. The second dummy wires 620 may extend in the vertical direction in the process of connecting the second bonding pads 512 and the conductive wires 200 of the uppermost semiconductor chip 510 of the plurality of second semiconductor chips 500 to the second dummy, and the second dummy wires 620 may support the second free end or overhang portion OH2 of the uppermost semiconductor chip 510 of the plurality of second semiconductor chips 500.

As described above, the first support structure 300 may support the free end or overhang portion OH of the uppermost semiconductor chip 110 of the plurality of first semiconductor chips 100 by compensating for the height difference between the package substrate 20 and the uppermost semiconductor chip 110. Accordingly, the first support structures 300 formed during the wire bonding process may prevent the first uppermost semiconductor chip 110 from bouncing (i.e., movement, vibrations, etc.), thereby reducing costs, and improving productivity.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
a package substrate;
a plurality of first semiconductor chips stacked on an upper surface of the package substrate in a stair-step configuration, the plurality of first semiconductor chips having an uppermost semiconductor chip at a first height from the upper surface of the package substrate, the uppermost semiconductor chip comprising a free end portion;
conductive wires respectively electrically connecting chip pads of the first semiconductor chips to substrate pads of the package substrate; and
a plurality of first support structures, each having a first end attached to the upper surface of the package substrate and an opposite second end with an end attached to the free end portion of the uppermost semiconductor chip, wherein the first support structures are inclined at an angle relative to the package substrate.

2. The semiconductor package of claim 1, wherein at least one of the chip pads of the uppermost semiconductor chip is on an upper surface of the free end portion, and
wherein the second ends of the first support structures supports are attached to a lower surface of the free end portion.

3. The semiconductor package of claim 1, wherein each of the first support structures comprises:
a wire bonding portion on the package substrate; and
a dummy wire having a first end joined to the wire bonding portion and an opposite second end contacting a lower surface of the free end portion.

4. The semiconductor package of claim 1, further comprising:
at least one second semiconductor chip on the uppermost semiconductor chip of the plurality of first semiconductor chips, the at least one second semiconductor chip comprising a free end portion; and
a plurality of second support structures, each having a first end attached to an upper surface of one of the plurality of first semiconductor chips and an opposite second end attached to the free end portion of the at least one second semiconductor chip.

5. The semiconductor package of claim 1, further comprising:
a plurality of second semiconductor chips stacked on the first semiconductor chips in a stair-step configuration opposite to the stair-step configuration of the first semiconductor chips, the plurality of second semiconductor chips having an uppermost semiconductor chip at a second height from an upper surface one of the first semiconductor chips; and
a plurality of third support structures, each having a first end attached to an upper surface of the one of the first plurality of semiconductor chips and an opposite second end attached to a free end portion of the uppermost semiconductor chip of the plurality of second semiconductor chips.

6. The semiconductor package of claim 1, wherein the angle is within a range of 0 degrees to 20 degrees.

7. The semiconductor package of claim 6, wherein the stair-step configuration of the plurality of first semiconductor chips extends in a first direction, and wherein each of the first support structures is angled toward the first direction.

8. The semiconductor package of claim 6, wherein the stair-step configuration of the plurality of first semiconductor chips extends in a first direction, and wherein each of the first support structures is angled toward a second direction opposite to the first direction.

9. The semiconductor package of claim 1, wherein the first support structures comprise at least one of copper (Cu), aluminum (Al), tungsten (W), nickel (Ni), molybdenum (Mo), gold (Au), silver (Ag), chromium (Cr), tin (Sn), and titanium (Ti).

10. The semiconductor package of claim 1, wherein a diameter of each of the first support structures is within a range of 1.0 mm to 3.5 mm.

11. A semiconductor package, comprising:
a package substrate;
a plurality of first semiconductor chips stacked on the package substrate in a stair-step configuration, the plurality of first semiconductor chips having an uppermost semiconductor chip at a first height from the package substrate, the uppermost semiconductor chip comprising bonding pads on an upper surface thereof, and the uppermost semiconductor chip comprising a free end portion;
conductive wires electrically connecting the bonding pads to the package substrate; and
a plurality of first support structures, each having an elongate linear shape from a first end attached to the upper surface of the package substrate to an opposite second end attached to the free end portion of the uppermost semiconductor chip, wherein the first support structures are inclined at an angle relative to the package substrate.

12. The semiconductor package of claim 11, wherein each of the first support structures comprises:
a dummy pad on the package substrate; and
a dummy wire having a first end joined to the dummy pad and an opposite second end contacting a lower surface of the free end portion.

13. The semiconductor package of claim 11, further comprising:
at least one second semiconductor chip on the uppermost semiconductor chip of the plurality of first semiconductor chips, the at least one second semiconductor chip comprising a free end portion; and a plurality of second support structures, each having a first end attached to an upper surface of one of the plurality of first semiconductor chips and an opposite second end attached to the free end portion of the at least one second semiconductor chip.

14. The semiconductor package of claim 13, wherein the at least one second semiconductor chip comprises a plurality of second semiconductor chips stacked on the first semiconductor chips in a stair-step configuration opposite to the stair-step configuration of the first semiconductor chips, the plurality of second semiconductor chips having an uppermost semiconductor chip at a second height from an upper surface of one of the first semiconductor chips; and a plurality of third support structures, each having a first end attached to an upper surface of the one of the first plurality of semiconductor chips and an opposite second end attached to a free end portion of the uppermost semiconductor chip of the plurality of second semiconductor chips.

15. The semiconductor package of claim 11, wherein the first support structures comprise at least one of copper (Cu), aluminum (Al), tungsten (W), nickel (Ni), molybdenum (Mo), gold (Au), silver (Ag), chromium (Cr), tin (Sn), and titanium (Ti).

16. The semiconductor package of claim 11, wherein a diameter of each of the first support structures is within a range of 1.0 mm to 3.5 mm.

*   *   *   *   *